United States Patent [19]
Chiou et al.

[11] Patent Number: 5,434,090
[45] Date of Patent: Jul. 18, 1995

[54] PROCESSING CHAMBER FOR PROCESSING SEMICONDUCTOR SUBSTRATES

[76] Inventors: Herng-Der Chiou, 146 W. El Freda Rd., Tempe, Ariz. 85284; Raul P. Torres, 15902 Two Rivers Cove, Austin, Tex. 78717

[21] Appl. No.: 172,988

[22] Filed: Dec. 27, 1993

[51] Int. Cl.⁶ ............................................. C23C 16/00
[52] U.S. Cl. ...................................... 437/10; 437/225; 437/247; 118/715; 118/725; 29/25.01; 219/390
[58] Field of Search ................ 118/715, 725; 219/390; 29/25.01; 437/225, 247, 10

[56] References Cited
U.S. PATENT DOCUMENTS
3,193,419 7/1965 White ............................ 437/10

OTHER PUBLICATIONS

Cohen, et al.; "Silicon Dioxide Thermally Grown in a Silicon Nitride Ambient;" J. Electrochem. Soc.; vol. 4, No. 4, p. 506 (1969).

Paul F. Schmidt; "Contamination-Free High Temperature Treatment of Silicon or Other Materials;" J. Electrochem. Soc.; vol. 130, No. 1, pp. 196-199 (1983).

Wilson, et al.; Mat. Res. Soc. Symp. Proc., vol. 52, pp. 181-191 (1986).

*Primary Examiner*—Richard Bueker

[57] ABSTRACT

A solid metal-gettering material is used between walls of a double-walled processing chamber, such as a furnace tube and an RTP chamber. The solid metal-gettering material getters metal before the metal reaches the substrate within the processing zone of a the processing chamber. Polysilicon pellets and silicon carbide pellets are examples of types of solid metal-getting materials, although other materials may be used. A purge gas may be flow within the gap or the gap may be evacuated while the pellets lie within the gap. Limitations on shapes and sizes of the pellets and purge gas flow rate are determined by the size of the gap.

20 Claims, 2 Drawing Sheets

PROCESSING CHAMBER FOR PROCESSING SEMICONDUCTOR SUBSTRATES

FIELD OF THE INVENTION

The present invention relates to the field of processing chambers, and in particular, to double-walled processing chambers for processing semiconductor substrates.

BACKGROUND OF THE INVENTION

Highly reliable semiconductor devices require metallic contamination to be very low. Typically, semiconductor substrates are processed in a furnace tube or a rapid thermal processor (RTP) chamber having a single wall made of quartz. Most metallic contaminants migrate very quickly through quartz. Therefore, any metallic contamination present at the outer surface of the single-wall quartz chamber is likely to migrate through the wall and may reach the substrate, particularly at high processing temperatures (900 degrees Celsius and higher).

A double-walled quartz tube having hydrogen chloride (HCl) gas between its walls has been used in an attempt to reduce metallic contamination. Still, HCl gas has problems. HCl is corrosive and is irritating to humans.

Polycrystalline silicon (polysilicon) and silicon carbide liners have been used inside or outside furnace tubes. When a liner is used within a furnace tube, particles are generated as the liner is inserted into the tube. Particles generated by the insertion may end up on substrates that are processed within the tube. Generally, a higher number of particles on a substrate translates to lower yield. The liner may also be placed outside of the tube. Polysilicon and silicon carbide are not insulators. If the liner contacts the furnace element or other wiring, an electrical short may occur, and the furnace may be damaged. Even worse, if a person is working with the furnace and the liner contacts the furnace element, the person may be electrocuted if the furnace has not be properly disabled.

SUMMARY OF THE INVENTION

The present invention includes a processing chamber for processing a semiconductor substrate. The processing chamber comprises a first wall, a second wall, a gap, and a solid metal-gettering material. The first wall has an inner surface and an outer surface. A processing zone is defined by at least a portion of the inner surface. The second wall has an inner surface and an outer surface, and the second wall lies outside the first wall. The gap lies between the outer surface of the first wall and the inner surface of the second wall and is separated from the processing zone by the first wall. The solid metal-gettering material lies within the gap. The present invention also includes processes for processing the semiconductor substrate using the processing chamber.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION OF EMBODIMENTS

A double-walled processing chamber with a gap filled with a solid metal-gettering material may be used to reduce metal contamination of semiconductor substrates. Polysilicon pellets and silicon carbide pellets are examples of such solid metal-gettering materials. The present invention is better understood with embodiments that are described below.

Furnace Tube with Polysilicon Pellets

Figure 1:
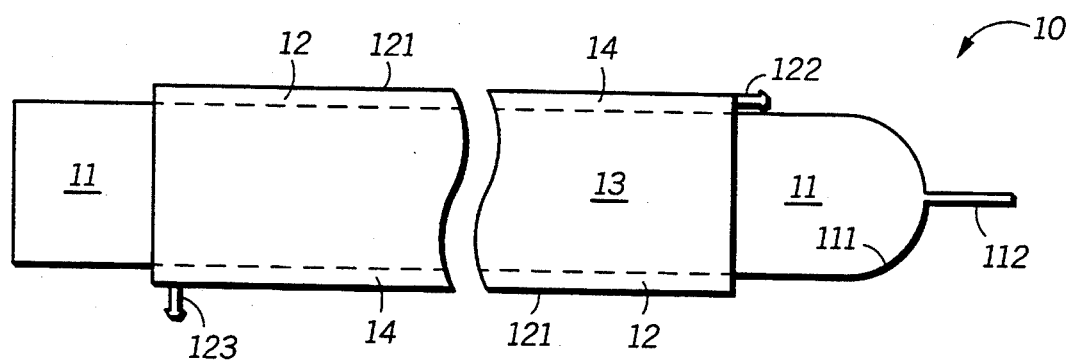
FIG. 1 includes a side view of a double-walled furnace tube.

FIG. 1 includes a side view of a double-walled furnace tube 10. The tube includes an inner tube 11, an outer tube 12, and a gap 14 between the inner tube 11 and the outer tube 12. The outer tube can be shorter, the same length, or slightly longer than the inner tube 11. The inner tube 11 includes a furnace zone 13 and a process gas inlet 112. The gap 14 lies between the wall 111 of the inner tube 11 and the wall 121 of the outer tube 12. The gap 14 has a purge gas inlet 122 and a purge gas outlet 123, both of which are a type of port.

The tube 10 is made of a high-temperature-resistant, relatively non-reactive material, such as quartz and the like. The size of the furnace zone 13 and the tubes 11 and 12 depends on the size of the semiconductor substrates to be processed. For example, to process substrates about 125 millimeters in diameter, the inner diameter of the inner tube 11 may be 170 millimeters, and the outer diameter of the inner tube 11 may be 176 millimeters. The inner diameter of the outer tube 12 may be 184 millimeters and the outer diameter of the outer tube 12 may be 190 millimeters. Therefore, the gap 14 is about 4 millimeters wide. The width of the gap 14 is in a range of about 2 to 15 millimeters and typically is 3 to 7 millimeters. These numbers are to illustrate and are not meant to limit the invention.

Figure 2:
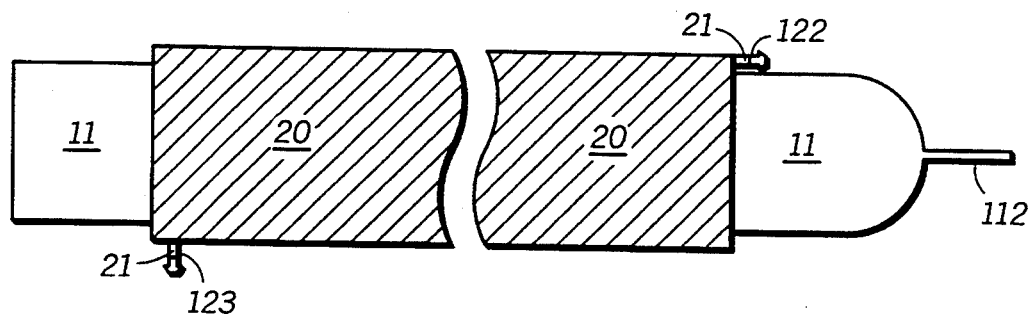
FIG. 2 includes a side view of the furnace tube of FIG. 1 after the gap between the walls is filled with polysilicon pellets.

FIG. 2 includes an illustration of the double-walled furnace tube 10 after the gap 14 is filled with polysilicon pellets 20. Quartz wool 21 is placed in the purge gas inlet and outlet 122 and 123 to keep the pellets 20 from leaving the gap 14. The polysilicon pellets 20 act as a gettering source. The polysilicon pellets 20 are semiconductor grade and may be obtained from Ethyl Corporation, 451 Florida Boulevard, Baton Rouge, La. 70801. The polysilicon pellets are high purity spherical particles with a diameter distribution in a range of about 0.1–3.0 millimeters. The average size is about 0.85–0.90 millimeters. Within the polysilicon pellets 20, the total transition metal content may be less than 10 parts per billion atomic (ppba).

The double-walled furnace tube 10 is placed into a conventional, horizontally-oriented semiconductor furnace (not shown). The double-walled furnace tube 10 is surrounded by a heating element (not shown). Gas lines (not shown) are typically connected to the process gas inlet 112 and the purge gas inlet 122. The purge gas outlet 123 is typically vented to a scavenger box (not shown) that is exhausted to a scrubber (not shown).

Figure 3:
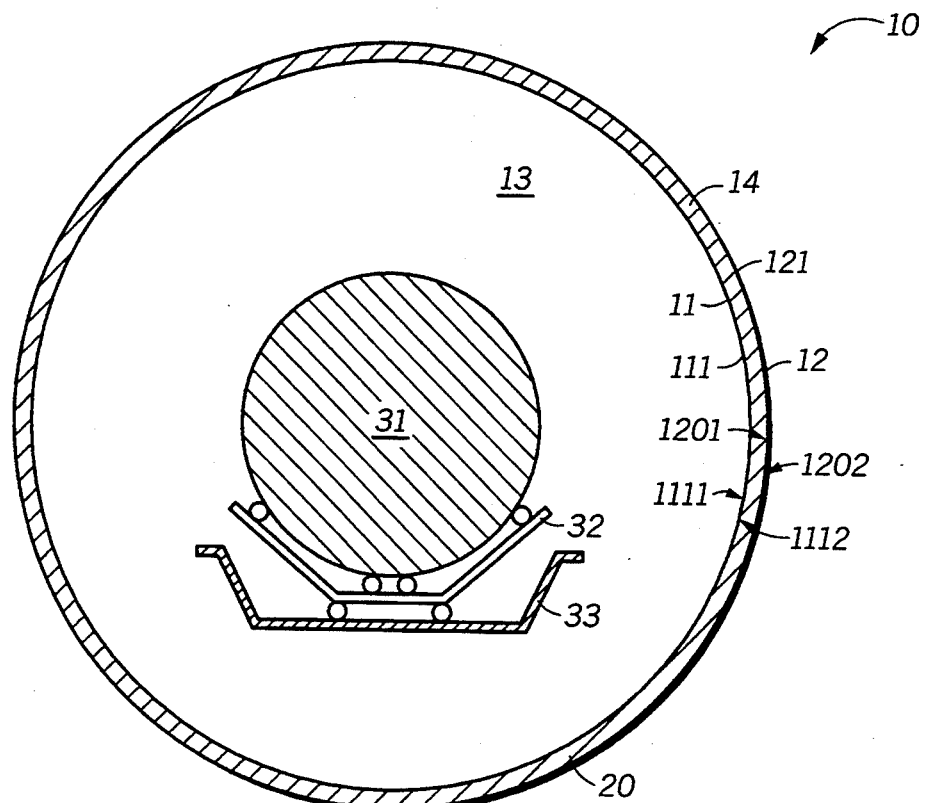
FIG. 3 includes a cross-sectional view of a portion of the furnace tube of FIG. 2 and a semiconductor substrate.

FIG. 3 includes a cross-sectional view of the double-walled furnace tube 10 during processing. The double-walled furnace tube 10 includes the inner and outer tubes 11 and 12 having walls 111 and 121, respectively. The wall 111 has an inner surface 1111 and an outer surface 1112, and the wall 121 has an inner surface 1201 and an outer surface 1202. Within the furnace zone 13 is a boat 32 that lies on a paddle 33 and holds a semiconductor substrate 31. The paddle 33 is used to position the substrate 31 and boat 32 within the furnace zone 13. Typically a plurality of substrates are processed during the same furnace cycle, although only one substrate is seen in FIG. 3.

A high temperature process typically falls into three major categories: anneals, diffusions, and oxidations. A typical recipe starts at an idling temperature in a range of about 600 to 800 degrees Celsius. An idling gas flows through the process gas inlet 112 into the processing chamber 13. The idling gas includes an inert gas and/or an oxidizing bleed. The inert gas includes nitrogen, argon, helium, carbon dioxide, or the like, and the oxidizing bleed includes molecular oxygen, ozone, nitrous oxide, nitric oxide, or the like. The total gas flow rate into the furnace tube 10 through the process gas inlet 112 is usually in a range of about 5-60 standard liters per minute. The actual total gas flow rate depends on the inner diameter of the inner tube 11 and the size of the substrates 31. The substrates 31 are introduced into the furnace zone 13 on the paddle 33 at a controlled rate. After insertion, the furnace zone 13 is sealed. The seal may or may not be air tight.

Meanwhile, a purge gas flows through the gap 14. The purge gas includes at least one of the inert gases previously listed, and flows through the purge gas inlet 122 at a flow rate in a range of about 5-20 standard liters per minute. The purge gas is exhausted through the purge gas outlet 123 as previously discussed.

A controlled temperature ramp follows, and the double-walled furnace tube 10 and substrates 31 reach the processing temperature which is typically in a range of about 800-1300 degrees Celsius. At this elevated temperature range, a processing gas is introduced into the chamber 13. If the process is a diffusion or anneal, the processing gas typically includes at least one of the inert gases previously listed. The processing gas may also include an oxidizing bleed and/or a chlorinating bleed. The oxidizing bleed may include molecular oxygen, ozone, nitrous oxide, nitric oxide, steam, or the like, and the chlorinating bleed may include molecular chlorine, hydrogen chloride, trichloroethane, trichloroethene, or the like. If the process is an oxidation, the processing gas may include an oxidant (molecular oxygen, ozone, nitrous oxide, nitric oxide, steam, or the like). Alternatively, the processing gas may also include, the chlorinating bleed, a nitriding source (ammonia, nitrous oxide, nitric oxide, or the like), or a diluting gas (nitrogen, argon, helium, or the like). During the high-temperature processing step, the purge gas continues to flow through the gap 14.

After the high temperature process step, temperatures of the tube 10 and substrates 31 are lowered in a controlled ramp down, and the substrates 31 are withdrawn from the robe 10 by removing the paddle 33 from the tube 10. To increase the ramp down rate, the purge gas flow rate may be increased. For example, if the purge gas flow rate during processing is about 5 standard liters per minute, the purge gas rate may be increased to about 20 standard liters per minute during the ramp down.

Other Processing Chambers

The solid metal-gettering material may be used with other types of processing chambers. The polysilicon pellets 20 may be used for a double-walled furnace tube for a vertically-oriented furnace. Also, silicon carbide pellets may be used with an RTP. An RTP is typically used for short-time, high temperature processes, thin oxidations, and thin film depositions. Large-area incoherent energy sources (not shown) emit radiant light which then heats the substrate 31. This allows very rapid heating and cooling. An RTP chamber isolates the substrate in a controlled environment and couples heat from the radiant energy sources to the substrate.

Figure 4:
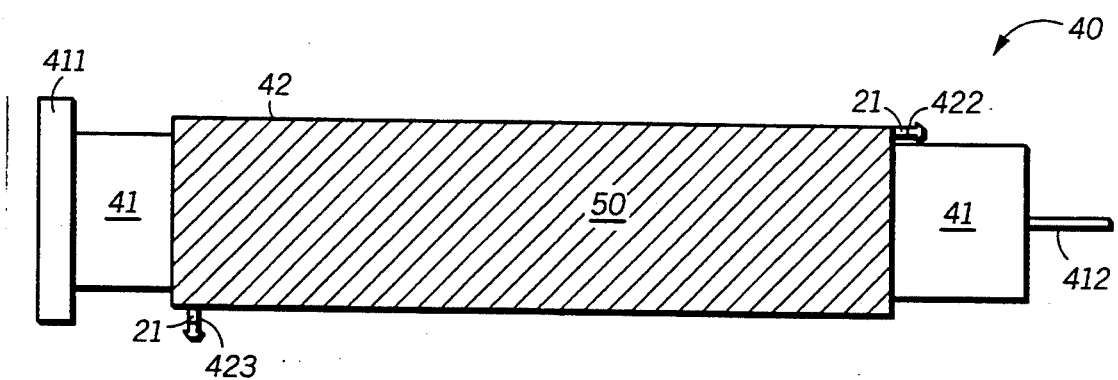
FIG. 4 includes a side view of a double-walled RTP chamber with polysilicon pellets between the walls.
Figure 5:
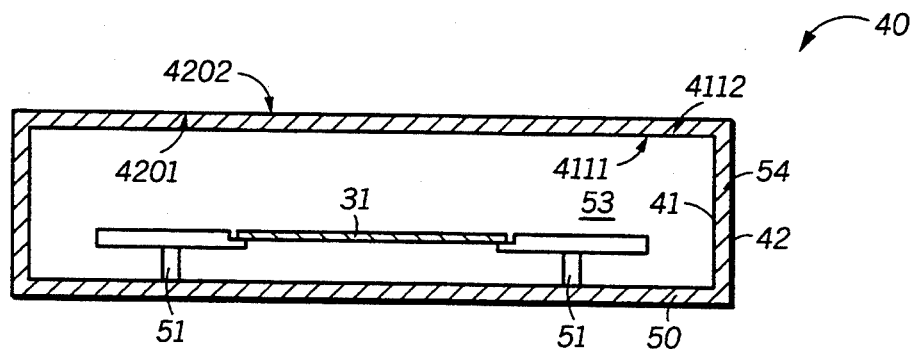
FIG. 5 includes a cross-sectional view of a portion of the RTP chamber of FIG. 4 and a semiconductor substrate.

FIGS. 4 and 5 include side and cross-sectional views, respectively, of a double-walled RTP chamber 40 of an RTP (not shown). The RTP chamber 40 includes of an inner wall 41, an outer wall 42, and a gap 54 that lies between the inner wall 41 and the outer wall 42. The RTP chamber 40 has a process gas inlet 412 and a door flange 411 that are attached to the inner wall 41. Typically, the length of the outer wall 42 is the same or less that the length of the inner wall 41. The gap 54 has a length, such that the substrate 31 is not seen from the side view of the RTP chamber 40 in FIG. 4. In another embodiment, the outer wall 42 may lie adjacent to all or a portion of the side of the inner wall 41 that lies adjacent to the processing gas inlet 412 (opposite the side of the door flange 411). Therefore, the gap 54 may be extended to lie along the side of the inner wall 41 that lies adjacent to the processing gas inlet 412. The gap 54 is filled with a solid metal-gettering material, such as silicon carbide (SiC) pellets 50. Similar to the furnace tube 10, the gap has a purge gas inlet 422, and a purge gas outlet 423. Also, the RTP chamber may have purge gases flowing through the gap 54 similar to the furnace tube 10. The temperature of the substrate 31 may be monitored by an optical pyrometer (not shown) or a thermocouple (not shown) mounted near or at the substrate 31.

The gap 54 is typically narrower compared to the gap 14 of the furnace tube 10. Therefore, the size of the SiC pellets 50 may be smaller, and the purge gas flow rate through the gap 54 may be lower compared to that used for gap 14. Still, the considerations for determining the size of the SiC pellets 50 and the purge gas flow rate for gap 54 would be similar to those previously described for gap 14. If the substrate 31 is heated by lamps, the pellets must be able to getter metallic contaminants without blocking too much of the energy of the lamps.

SiC is a good material because it can transmit between 50-80 percent of energy radiating from tungsten halogen lamps that are used in RTPs. Also, the width of the gap 54 should be thin enough to allow good energy transmission when the SiC pellets 50 lie within the gap 54. In general, the gap 54 should not be wider than about 1 millimeter if the substrate 31 is heated by tungsten halogen lamps. The width of the gap 54 may be the same or different between each of the sides of the RTP chamber 40. The concerns may be similar for other radiation sources used to heat the substrate 31 within the RTP chamber 40. Selection of the pellet material and the thickness of the gap are chosen to allow a significant portion of the radiation to pass to the substrate 31.

If an optical pyrometer is used, the furnace may need to be specially calibrated for the use of the SiC pellets 50 within the gap 54. Otherwise, a portion of the RTP chamber 40 may not have a gap 54 where the optical pyrometer would be used to monitor the temperature of the substrate 31. As an alternative, a thermocouple may be used to monitor the temperature. The examples within this paragraph have assumed that the substrate 31 is silicon. If the substrate 31 is germanium, a different material may be used for the pellets. Still, the considerations are the similar; most of the energy should be transmitted to the substrate 31 and the temperature of the substrate 31 during processing should be monitored.

FIG. 5 includes a cross-sectional view illustrating the RTP chamber 40 during processing of the substrate 31. The RTP chamber 40 may be surrounded by tungsten halogen lamps (not shown) or other heating means (not shown). The inner wall 41 has an inner surface 4111 and an outer surface 4112, and the outer wall 42 has an inner surface 4201 and an outer surface 4202. The inner surface 4111 of the inner wall 41 defines the processing zone 53. The semiconductor substrate 31 lying on a substrate holder 51 within the processing zone 53. Typically, a single substrate 31 is processed at a time within the processing zone 53, although a plurality of substrates 31 may be processed if the processing zone 53 is designed to process more than one substrate at a time.

Processing the substrate 31 within the RTP chamber 40 is similar to processing the substrate 31 within the furnace tube 10 although there are some dissimilarities. The substrate 31 is typically inserted into the RTP chamber 40 when the temperature within the processing zone 53 is no more than about 300 degrees Celsius. The processing chamber 40 is sealed by a door that lies near the door flange 411. In less than a minute, the substrate 31 is at the processing temperature that may be in a range of about 800–1300 degrees Celsius. The ramping up may be performed in stages to reduce the likelihood of substrate warping and/or slip. At this temperature, an anneal, oxidation, or drive is performed for a time typically in a range of 5–300 seconds. One skilled in the art appreciates that more than one operation may be performed during the same RTP cycle. Therefore, a thin oxide layer may be grown at one temperature and then annealed at a higher temperature during the same RTP cycle. Before removing the substrate 31, the temperature of the substrate 31 is typically ramped down to be about 300 degrees Celsius or lower. The door (not shown) is opened and the substrate 31 is removed.

A purge gas may flow through the gap 54 similar to the purge gas flowing through the gap 14 of the furnace tube 10. The types of solid-gettering material, their shapes and sizes, the types of purge gases and their flow rates are similar to those previously described. Because gap 54 of the RTP chamber 40 is typically narrower than gap 14 of the furnace tube 10, the upper limit for particle size and purge gas flow rate for the gap 54 are smaller for RTP chamber 40 compared to the gap 14 particle size and purge gas flow rate of the furnace tube 10.

Options

In addition to polysilicon and SiC, the solid metal-gettering material within the gap 14 or 54 can be another material including germanium, carbon, silicon nitride, amorphous silicon, single crystal silicon, or any combination thereof. The material may be doped or undoped. Also, the material is typically dissimilar compared to the processing chamber material (furnace tube 10 or RTP chamber 40). The shape of the solid metal-gettering material may be cubic, spherical, ellipsoid-shaped, or virtually any other shape.

The size of the material may vary. On one hand, a hollow cylinder of solid metal-gettering material may lie within the gap 14 or 54. The inner diameter of the cylinder is slightly wider than the outer diameter of the inner tube 11, and the outer diameter of the cylinder is slightly narrower than the inner diameter of the outer tube 12. In this case, the material would be slid around the inner tube 11 before completely welding the inner tube 11 and the outer tube 12 together. In general, metal gettering ability increases with surface area. Therefore, particles, such as the pellets 20 or 50, have a higher metal gettering ability compared to the hollow cylinder because the particles have a higher surface area per unit volume hollow cylinder. If the particle size is too small, then the purge gas flow through the gap may be inhibited. Therefore, at least one dimension of the particles are generally in a range of about 0.1–15 millimeters. At least one of the dimensions of the particles may be larger than the width of the gap, but those particles may be difficult to insert or remove from the gap. In many applications, all dimensions of the particles are smaller than the width of the gap and are typically in a range of about 0.1–3.0 millimeters. Still, the actual dimensions of the particles depends on the sizes of the gap. A range of particle size may be used to increase the packing density of the polysilicon pellets 20 within the gap 14 or 54.

A purge gas may flow through the gap at any time including idling, processing, or during temperature ramp ups or ramp downs. The purge gas may be any inert gas or reducing gas. The reducing gases may include carbon monoxide, hydrogen, methane, or the like. In addition, any combination of inert or reducing gases may be used. Alternatively, the gap may be evacuated with the pellets 20 or 50 or other solid metal-gettering material within the gap. If the gap is evacuated, the purge gas inlet and outlet may be sealed, or the purge gas inlet and outlet may be removed and the inner tube and outer tube may be completely welded together near the ends of one of those tubes.

The pellets 20 or 50 may be used for virtually any length of time. In many applications, the pellets 20 or 50 are used until the furnace tube 10 or RTP chamber 40 is to be cleaned or discarded. In other applications, the pellets 20 or 50 may be reused in the furnace tube 10 or the RTP chamber 40 after it is cleaned or replaced.

The pellets 20 or 50 may need to be regenerated if the contamination level in substrates processed within the processing chamber is too high or if a large number of substrates have been processed within the processing chamber. For example, the substrates have a sodium concentration after processing of about 1.3E8 atoms per cubic centimeter and the limit is 1.2E8 atoms per cubic centimeter, or 10,000 substrates have been processed since the pellets 20 or 50 have been installed or last regenerated and the limit is 10,000 substrate. Also, the pellets 20 or 50 may be regenerated on a scheduled basis, such as once per day or once per week. To regenerate the pellets 20 or 50, a reducing gas should flow through the gap 14. The reducing gas may include hydrogen, carbon monoxide, methane, molecular chlorine, hydrogen chloride, or the like. The reducing gas may also include a combination of any of those gases and/or be diluted with an inert gas. Regeneration is not required but may help the pellets 20 or 50 to increase their metal gettering ability when the pellets 20 or 50 are used for extended periods of time.

Regeneration may not be necessary if a non-explosive forming gas is used during processing and/or idling of the furnace tube 10 or RTP chamber 40. By forming gas, it is meant that the purge gas includes a flammable component and an inert component and the composition is such that the concentration of the flammable component in the purge gas is less than the lower flammability limit of the flammable component in air. If the purge gas has a flammable component and its concentration is higher than the lower flammability limit in air, the purge gas outlet 123 may need to be connected to a burn box to burn the gas before it is vented to the scrubber. Such burn boxes are typically used with furnaces that performed hydrogen alloying steps.

Benefits of the Embodiments

A benefit of a doubled-walled high temperature process chamber (furnace tube 10 or RTP chamber 40) filled with pellets 20 or 50 is the increased metallic gettering efficiency due to the large amount of surface area provided by the pellets 20 or 50. The risk of adverse effects of metallic contamination to the substrates 31 is high during the formation of a gate dielectric layer (regardless of the temperature at which the layer is formed), such as a gate oxide layer or the like, and when the substrates 31 are processed at high temperatures (900-1200 degrees Celsius). Metallic contamination may originate from particles (not shown) emitted from a furnace element or other heating source (not shown) during heating. Anytime a processing step is performed at a temperature higher than 600 degrees Celsius, the pellets should be used if metallic contamination is a concern. The substrates are processed in the furnace tube 10 with polysilicon pellets 20 may have a sodium concentration after processing of about 0.9E18 atoms per cubic centimeter, whereas substrates processed under similar conditions in a conventional single-walled furnace tube may have a sodium concentration after processing of about 1.8E8 atoms per cubic centimeter. In other words, the sodium concentration is about half. Although the amount of reduction outside the 1E8 atoms per cubic centimeter range is not known, substrates processed with any of the embodiments is expected to have less sodium concentration than if they were processed with a conventional single-wailed furnace tube.

The use of a purge gas (an inert and/or reducing gas) through the gap helps to reduce the likelihood that the polysilicon pellets become oxidized. In oxidation of the polysilicon pellets 20 occurs, the polysilicon pellets 20 may lose some of their metallic gettering ability. As previously stated, the polysilicon pellets 20 may be regenerated if needed.

In addition, using an embodiment of the present invention reduces health and safety concerns of HCl because the polysilicon pellets 20 do not have the corrosive and toxic properties of HCl. Further, elimination of HCl from the gap also reduces wear and tear on equipment and exhaust systems (scavenger box and scrubber).

The doubled-wailed furnace robe 10 filled with polysilicon pellets 20 does has a lower level of problems compared to a conventional furnace tube having a silicon carbide or polysilicon liner. First, the polysilicon pellets 20 lie within the gap 54 and are separated from a furnace element by the outer wall 12. Therefore, the double-walled furnace tube 10 with the polysilicon pellets virtually eliminates the danger of electrocution compared to a liner lying outside a conventional furnace tube. Second, the polysilicon pellets 20 are not directly exposed to the substrates 31 because the inner wall lies between the polysilicon pellets 20 and the substrates 31. Therefore, particle problems associated with a liner slid inside a furnace tube is also virtually eliminated. Further, the double walled furnace tube 10 with the polysilicon pellets 20 has less thermal mass compared to the conventional furnace tube with a liner. A lower thermal mass allows the double-walled furnace tube 10 with polysilicon pellets 20 to have a higher temperature ramp down rate compared to the furnace tube with the liner. The higher temperature ramp down rate decreases the process cycle time. Also, the flow rate of the purge gas within the gap 14 may be used to further increase the temperature ramp down rate.

The doubled-wall furnace tube 10 filled with polysilicon pellets 20 should cost less than a conventional single-walled furnace tube with a silicon carbide or polysilicon liner. If the liner becomes damaged (cracked or broken), the liner is usually replaced. Unlike the liner, the pellets are particles. If the pellets are broken into smaller particles, they can still be used within the gap.

The double-walled processing chamber filled with pellets 20 or 50 should last longer than a conventional single-walled processing chamber (furnace tube or RTP chamber) because the pellets 20 or 50 getter metal. The reduction of metallic contamination increases the reliability and reduces the early field failure rate of devices formed on the substrates. Therefore, the cost of using a conventional single-walled processing chamber may actually be higher in the long term because the chamber may need to be replaced sooner or the yield of the substrates may be lower. Even if the yield increase is only one die per substrate higher, the cost of the double-wailed chamber with polysilicon pellets 20 may actually make it less expensive to use compared to a conventional single-walled processing chamber.

In the foregoing specification, the invention has been described with reference to specific embodiments thereof. However, it will be evident that various modifications and changes can be made thereto without departing from the broader spirit or scope of the invention as set forth in the appended claims. Accordingly, the specification and drawings are to be regarded in an illustrative rather than a restrictive sense.

What is claimed is:

1. A processing chamber for processing a semiconductor substrate comprising:
    a first wall having an inner surface and an outer surface, wherein a processing zone is defined by at least a portion of the inner surface;
    a second wall having an inner surface and an outer surface, wherein the second wall lies outside the first wall;
    a gap, wherein the gap: lies between the outer surface of the first wall and the inner surface of the second wall; and is separated from the processing zone by the first wall; and
    a solid metal-gettering material lying within the gap.

2. The processing chamber of claim 1, wherein the processing chamber is selected from a group consisting of a furnace tube and a rapid thermal processor chamber.

3. The processing chamber of claim 1, wherein the solid metal-gettering material includes a material selected from a group consisting of silicon, carbon, germanium, silicon carbide, and silicon nitride.

4. A furnace tube for processing a semiconductor substrate comprising:
   a first wall having an inner surface and an outer surface, wherein a processing zone is defined by at least a portion of the inner surface;
   a second wall having an inner surface and an outer surface, wherein the second wall lies outside the first wall;
   a gap, wherein the gap: lies between the outer surface of the first wall and the inner surface of the second wall; and is separated from the processing zone by the first wall; and
   a solid metal-gettering material lying within the gap, wherein the solid metal-gettering material is selected from a group consisting of undoped polysilicon and doped polysilicon.

5. The furnace tube of claim 4, further comprising:
   a port extending through the second wall to the gap; and
   quartz wool adjacent to the port to reduce the likelihood of the solid metal-gettering material from leaving through the port.

6. A process for processing a semiconductor substrate comprising the steps of:
   providing a processing chamber including:
      a first wall having an inner surface and an outer surface, wherein a processing zone is defined by at least a portion of the inner surface;
      a second wall having an inner surface and an outer surface, wherein the second wall lies outside at least a portion of the first wall;
      a gap, wherein the gap: lies between the outer surface of the first wall and the inner surface of the second wall; and is separated from the processing zone by the first wall; and
      a solid metal-gettering material lying within the gap;
   inserting the substrate into the processing zone of the processing chamber;
   processing the substrate at a temperature of at least 600 degrees Celsius; and removing the substrate from the processing chamber.

7. The process of claim 6, wherein the processing chamber is selected from a group consisting of a furnace tube and a rapid thermal processor chamber.

8. The process of claim 6, wherein the solid metal-gettering material includes a material selected from a group consisting of silicon, carbon, germanium, silicon carbide, and silicon nitride.

9. The process of claim 6, wherein the step of processing:
   is selected from a group consisting of an anneal, a diffusion, and an oxidation: and
   is performed at a temperature of about 900–1200 degrees Celsius.

10. The process of claim 6, wherein the step of processing forms a gate dielectric layer.

11. The process of claim 6, wherein:
    the solid metal-gettering material is in the form of particles; and
    each particle has a dimension no greater than 15 millimeters.

12. The process of claim 6, wherein:
    the solid metal-gettering material is in the form of particles; and
    each particle has all dimensions in a range of 0.1–3.0 millimeters.

13. The process of claim 6, wherein the step of inserting is performed such that the solid metal-gettering material lies between the substrate and the second wall.

14. The process of claim 6, wherein during the step of processing, a gas flows through the gap, wherein the gas includes a material selected from a group consisting of nitrogen, argon, helium, hydrogen, carbon dioxide, carbon monoxide, methane, molecular chlorine, and hydrogen chloride.

15. A process for processing a semiconductor substrate comprising the steps of:
    providing a furnace tube for processing a semiconductor substrate comprising:
       a first wall having an inner surface and an outer surface, wherein a processing zone is defined by at least a portion of the inner surface;
       a second wall having an inner surface and an outer surface, wherein the second wall lies outside at least a portion of the first wall;
       a gap, wherein the gap:
          lies between the outer surface of the first wall and the inner surface of the second wall;
          is no greater than about 15 millimeters wide;
          is separated from the processing zone by the first wall; and
       a solid metal-gettering material lying within the gap, wherein the solid metal-gettering material is selected from a group consisting of undoped polysilicon and doped polysilicon;
    inserting the substrate into the processing zone of the furnace tube;
    processing the substrate at a temperature of at least 800 degrees Celsius; and
    removing the substrate from the furnace tube.

16. The process of claim 15, wherein the furnace tube further includes:
    a port extending through the second wall to the gap; and
    quartz wool adjacent to the port to reduce the likelihood of the solid metal-gettering material from leaving through the port.

17. The process of claim 15, wherein the step of processing:
    is selected from a group consisting of an anneal, a diffusion, and an oxidation; and
    is performed at a temperature of about 900–1200 degrees Celsius.

18. The process of claim 15, wherein:
    the solid metal-gettering material is in the form of particles; and
    each particle has all dimensions in a range of 0.1–3.0 millimeters.

19. The process of claim 15, wherein the step of inserting is performed such that the solid metal-gettering material lies between the substrate and the outer surface of the second wall.

20. The process of claim 15, wherein during the step of processing, a gas flows through the gap, wherein the gas includes a material selected from a group consisting of nitrogen, argon, helium, hydrogen, carbon dioxide, carbon monoxide, methane, molecular chlorine, and hydrogen chloride.

* * * * *